US008203266B2

(12) United States Patent
Egawa et al.

(10) Patent No.: US 8,203,266 B2
(45) Date of Patent: Jun. 19, 2012

(54) ELECTRON TUBE

(75) Inventors: Yasuyuki Egawa, Hamamatsu (JP);
Atsuhito Fukasawa, Hamamatsu (JP);
Motohiro Suyama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 360 days.

(21) Appl. No.: 12/257,129

(22) Filed: Oct. 23, 2008

(65) Prior Publication Data

US 2010/0102720 A1    Apr. 29, 2010

(51) Int. Cl.
*H01J 40/06* (2006.01)
(52) U.S. Cl. ......... 313/544; 313/542; 313/537; 313/538
(58) Field of Classification Search .................. 313/542, 313/544, 537, 538; 258/94
See application file for complete search history.

(56) References Cited

U.S. PATENT DOCUMENTS

| | | | |
|---|---|---|---|
| 4,178,529 A * | 12/1979 | Kennedy ....................... | 313/544 |
| 5,374,826 A | 12/1994 | LaRue et al. | |
| 5,498,926 A | 3/1996 | Kyushima et al. | |
| 5,594,301 A | 1/1997 | Sawai et al. | |
| 5,917,282 A * | 6/1999 | Suyama et al. ............... | 313/544 |
| 6,020,684 A | 2/2000 | Negi et al. | |
| 6,555,759 B2 * | 4/2003 | Tzanavaras et al. .......... | 174/260 |
| 6,720,996 B1 * | 4/2004 | Suyama et al. ............. | 348/216.1 |
| 2002/0079823 A1 * | 6/2002 | Gehring et al. ............... | 313/446 |
| 2004/0222433 A1 * | 11/2004 | Mazzochette et al. .......... | 257/99 |
| 2007/0007540 A1 * | 1/2007 | Hashimoto et al. ............. | 257/94 |
| 2007/0029930 A1 | 2/2007 | Suyama et al. | |
| 2007/0069645 A1 * | 3/2007 | Kyushima et al. ............ | 313/532 |

FOREIGN PATENT DOCUMENTS

| | | |
|---|---|---|
| JP | 4-292843 | 10/1992 |
| JP | 7-51729 | 11/1995 |
| JP | 7-320681 | 12/1995 |
| JP | 10-241623 | 9/1998 |
| JP | 10-332478 | 12/1998 |
| JP | 2000-149791 | 5/2000 |
| WO | WO 2007/111072 | 10/2007 |

OTHER PUBLICATIONS

R. Kalibjian, "A Phototube Using a Semiconductor Diode as the Multiplier Element," IEEE Transactions on Nuclear Science, Jun. 1966, pp. 54-62.
K. Arisaka et al., "XAX: a multi-ton, multi-target detection system for dark matter, double beta decay and pp solar neutrinos," pp. 1-16.
K. Arisaka, "XAX 10 ton Noble-Liquid Double-Phase TPC for Rare Processes," MS Power Point presentation at DUSEL Town Meeting, Washington, D.C., Nov. 3, 2007, pp. 1-19 (with two (2) page Town Meeting announcement).

* cited by examiner

*Primary Examiner* — Peter Macchiarolo
*Assistant Examiner* — Thomas A Hollweg
(74) *Attorney, Agent, or Firm* — Drinker Biddle & Reath LLP

(57) ABSTRACT

An electron tube of the present invention includes: a vacuum vessel including a face plate portion and a stem portion arranged facing the face plate portion; a photocathode arranged in the vacuum vessel and formed on the face plate portion; a projection portion arranged in the vacuum vessel, extending from the stem portion toward the face plate portion, and made of an insulating material; an electron detector arranged on the projection portion, made of a semiconductor, and having a first conductivity-type region and a second conductivity-type region; and a first conductive film covering a surface of the projection portion and to be electrically connected to the first conductivity-type region.

3 Claims, 8 Drawing Sheets

ELECTRON TUBE

BACKGROUND OF THE INVENTION

1. Field of the Invention

The present invention relates to an electron tube.

2. Related Background Art

U.S. Pat. No. 5,374,826 discloses an electron tube with an electronic detector for detecting photoelectrons from a photocathode. In such an electron tube, it is necessary to arrange the electron detector so that photoelectrons from the photocathode are efficiently collected, and it is further necessary to reliably perform wiring up to an arrangement place thereof.

SUMMARY OF THE INVENTION

An electron tube of the present invention includes: a vacuum vessel including a face plate portion and a stem portion arranged facing the face plate portion; a photocathode arranged in the vacuum vessel and formed on the face plate portion; a projection portion arranged in the vacuum vessel, extending from the stem portion toward the face plate portion, and made of an insulating material; an electron detector arranged on the projection portion, made of a semiconductor, and having a first conductivity-type region and a second conductivity-type region; and a first conductive film covering a surface of the projection portion and to be electrically connected to the first conductivity-type region.

DESCRIPTION OF THE PREFERRED EMBODIMENTS

Figure 1:
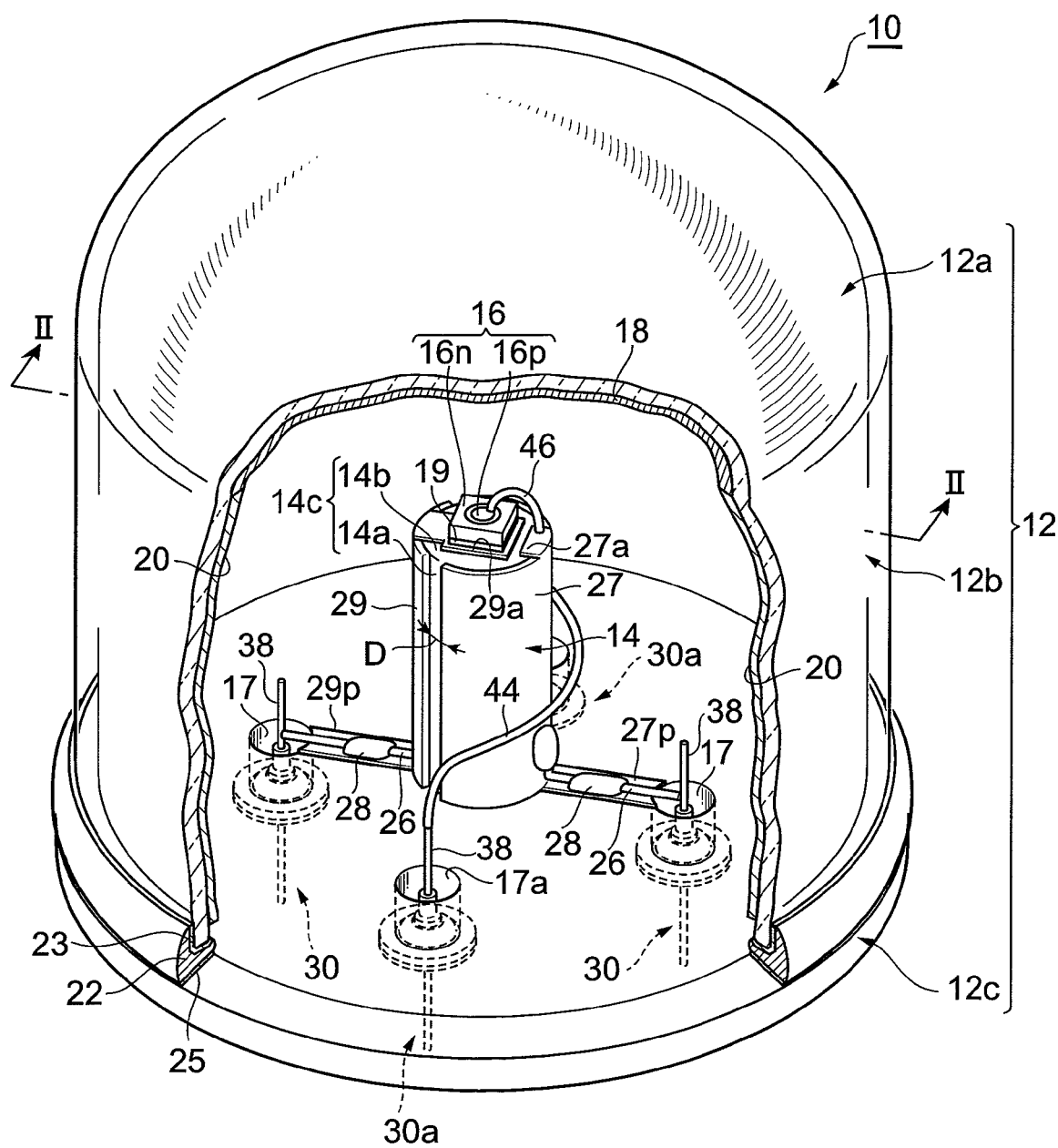
FIG. 1 is a perspective view, partially broken away, schematically showing an electron tube according to a first embodiment.

Hereinafter, a preferred embodiment of the present invention will be described in detail with reference to the accompanying drawings. For easy understanding of the description, components that are identical in the respective drawings are denoted whenever possible by identical reference numerals and overlapping description will be omitted.

First Embodiment

Figure 2:
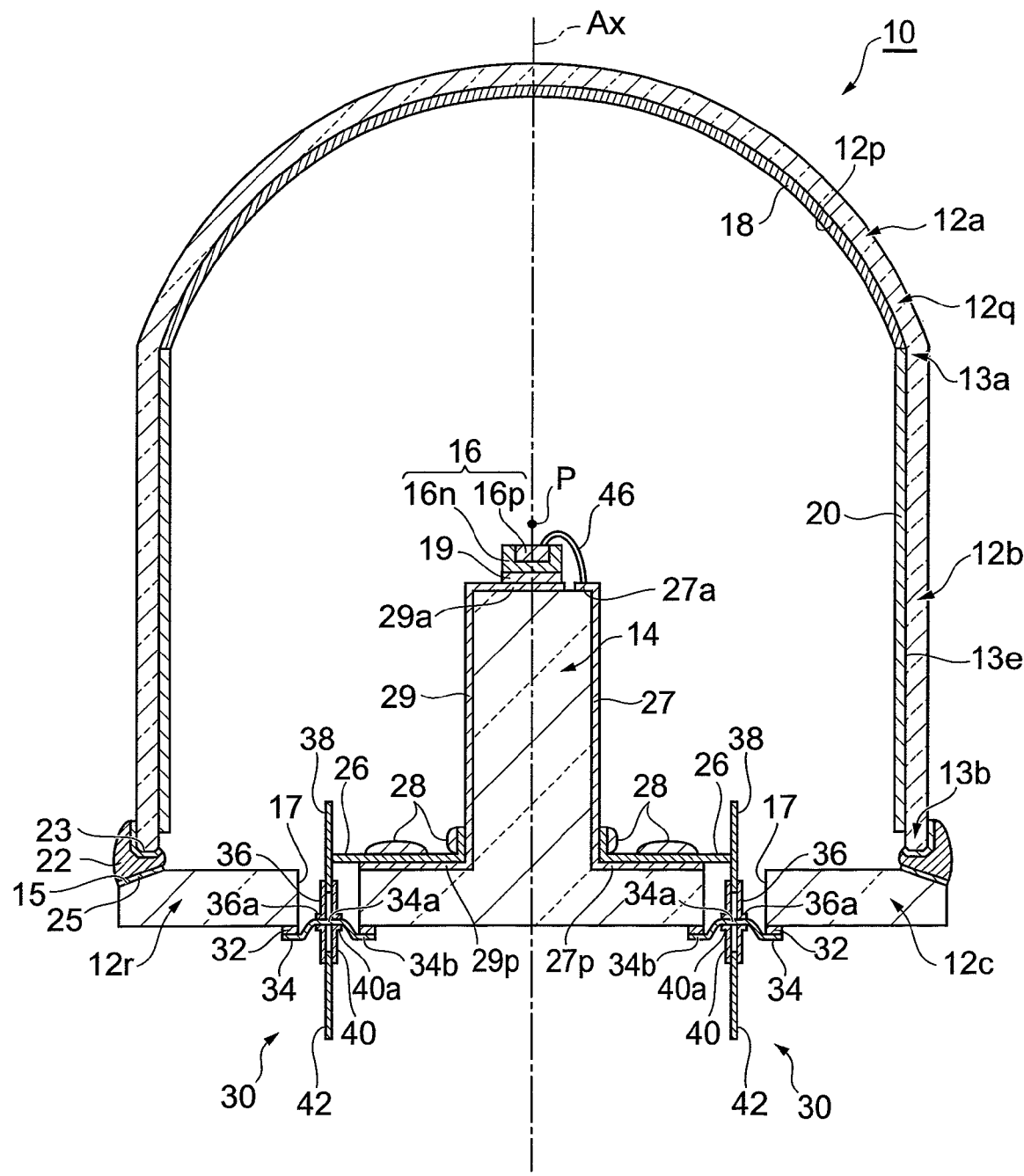
FIG. 2 is a sectional view along a line II-II shown in FIG. 1.
Figure 3:
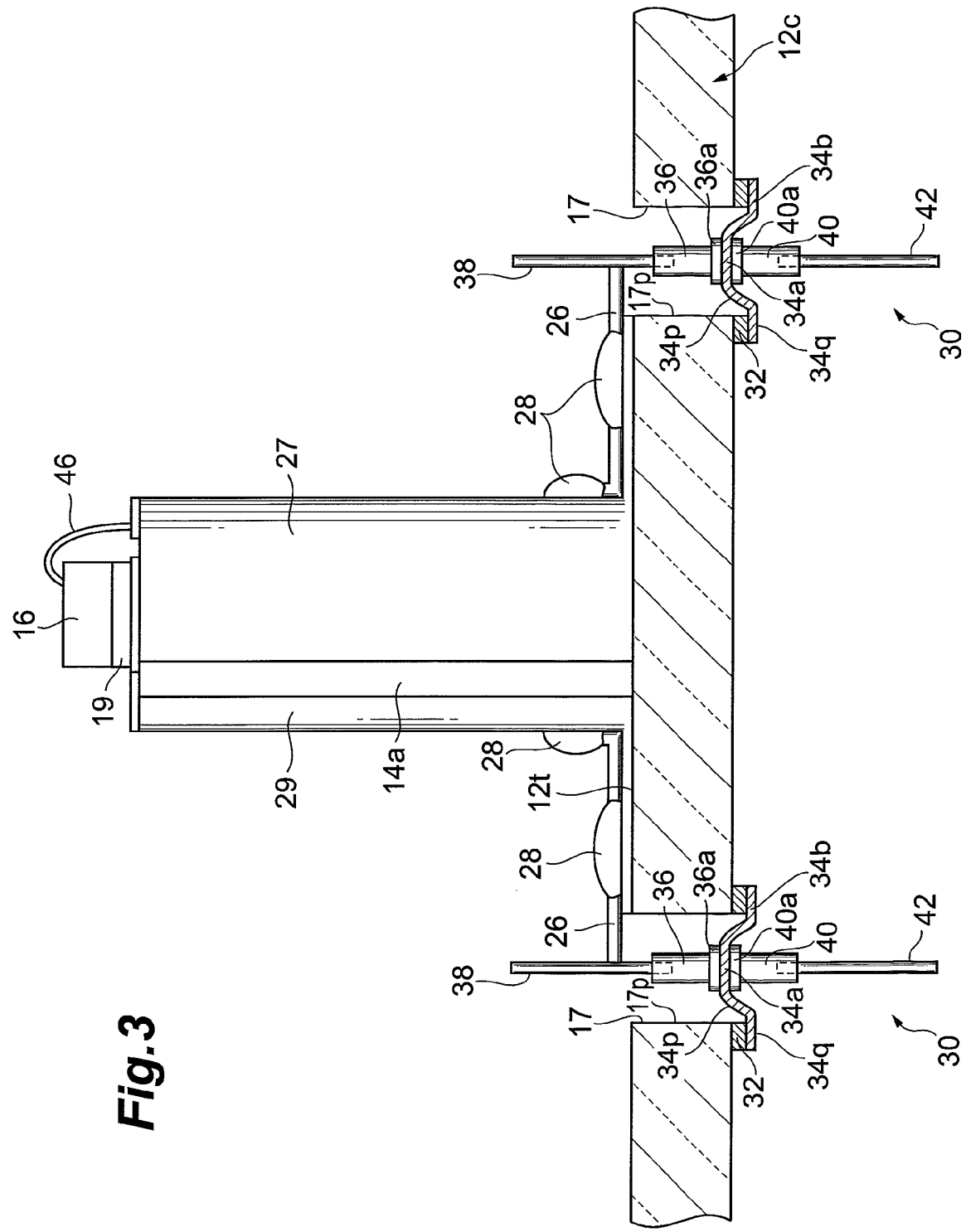
FIG. 3 is a partially enlarged view of a section along a line II-II shown in FIG. 1.
Figure 4:
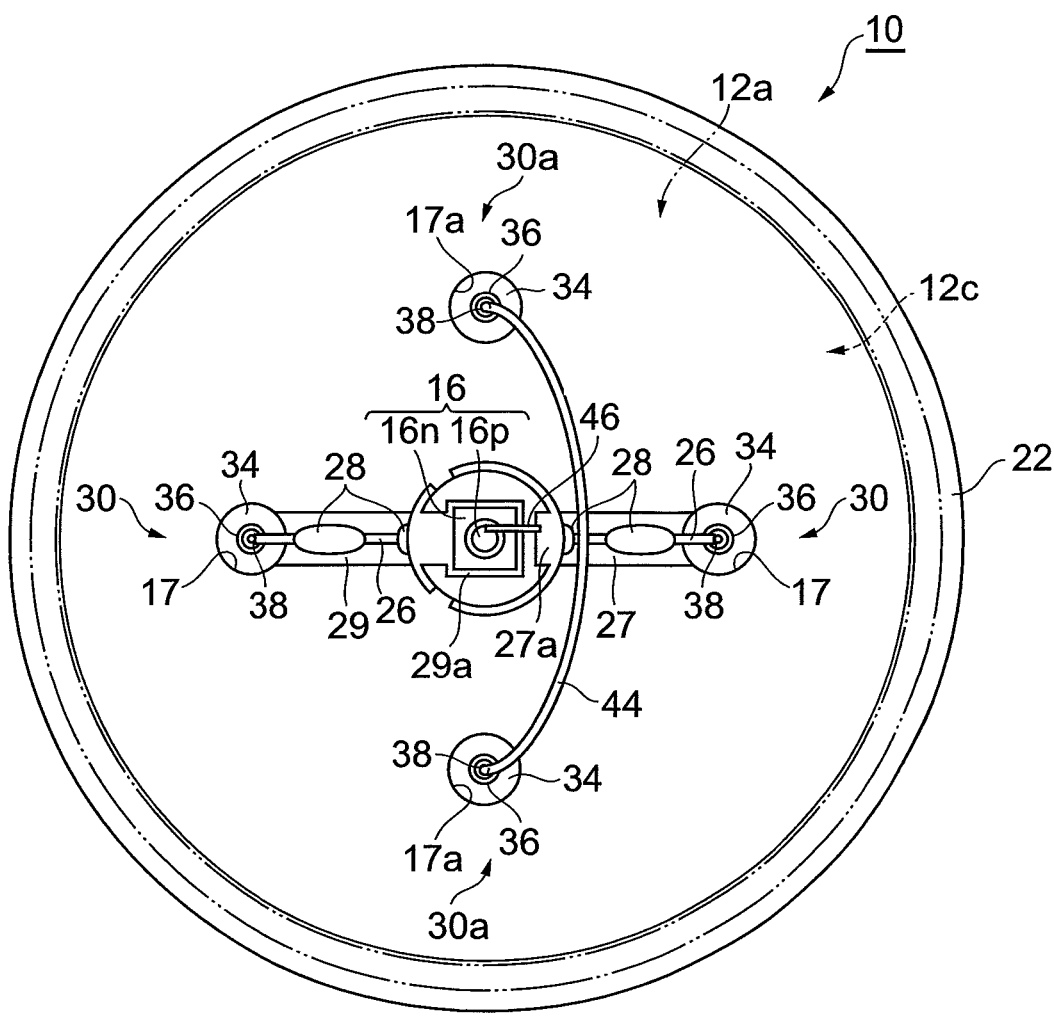
FIG. 4 is a plan view of an electron tube according to the first embodiment.
Figure 5:
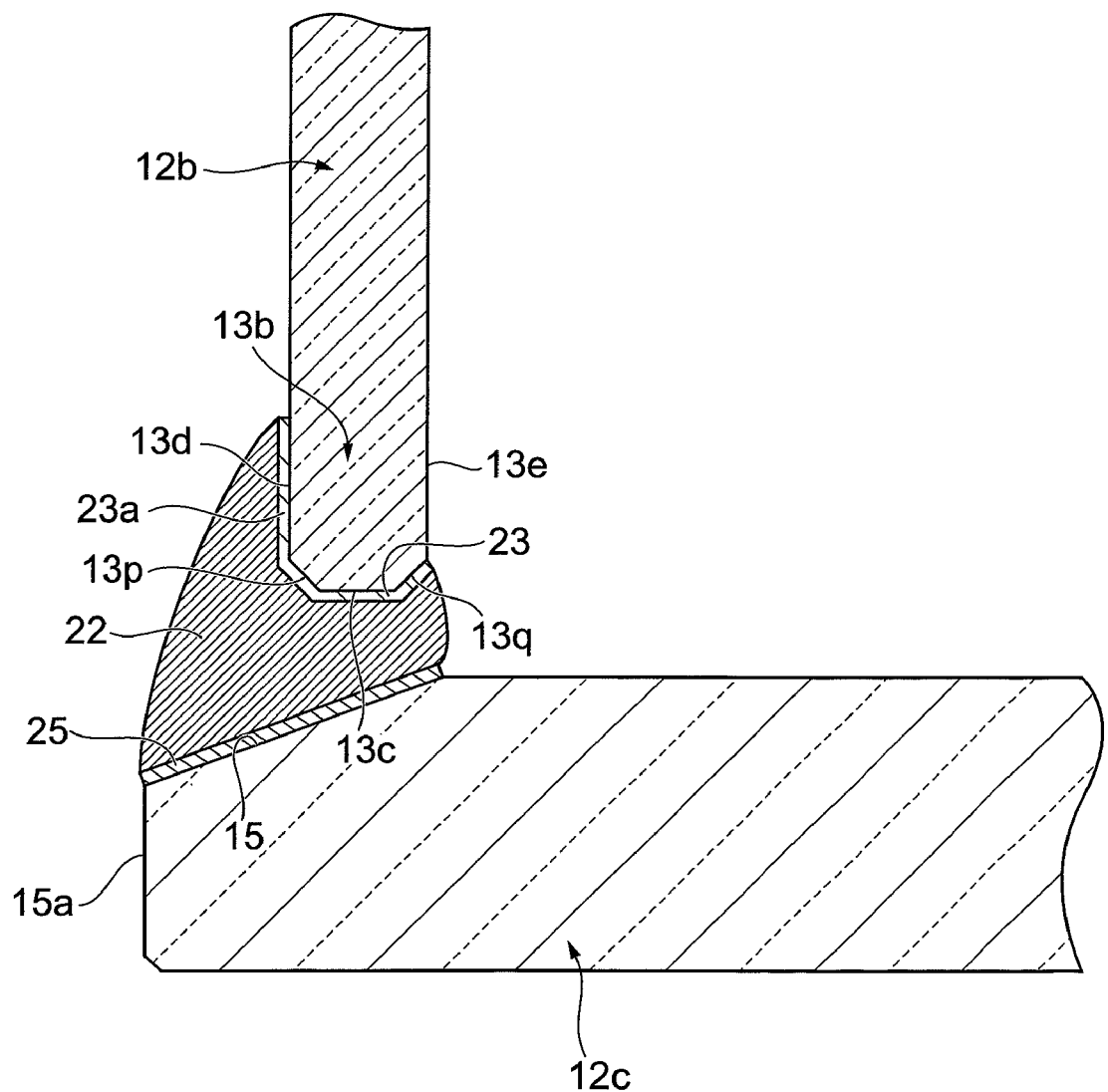
FIG. 5 is a partially enlarged view of FIG. 2.

FIG. 1 is a perspective view, partially broken away, schematically showing an electron tube according to a first embodiment. FIG. 2 is a sectional view along a line II-II shown in FIG. 1. FIG. 3 is a partially enlarged view of a section along a line II-II shown in FIG. 1. FIG. 4 is a plan view of an electron tube according to the first embodiment. FIG. 5 is a partially enlarged view of FIG. 2. As shown in FIG. 1 to FIG. 5, an electron tube 10 includes a vacuum vessel 12 that maintains a vacuum inside, a projection portion 14 arranged in the vacuum vessel 12, an electron detector 16 arranged on the projection portion 14, and a first conductive film 27 and a second conductive film 29 electrically connected to the electron detector 16.

The vacuum vessel 12 can include a face plate portion 12*a* provided on one surface 12*p* thereof with a photocathode 18, a side tube portion (valve) 12*b*, a stem portion (base) 12*c* arranged facing the photocathode 18. The face plate portion 12*a* blocks one opening of the side tube portion 12*b*. The stem portion 12*c* blocks the other opening of the side tube portion 12*b*. The face plate portion 12*a*, the side tube portion 12*b*, and the stem portion 12*c* are preferably made of synthetic silica. In this case, since the content of radioactive impurities contained in the synthetic silica is small, the quantity of radiation to be generated from the face plate portion 12*a*, the side tube portion 12*b*, and the stem portion 12*c* is reduced, and generation of noise at the time of radiation detection can be suppressed.

The face plate portion 12*a* is a plate-like member such as, for example, a dome, a hemispherical shell, a flat plate, or the like. A section in the thickness direction of the face plate portion 12*a* preferably extends along an arc having a center at a predetermined position P, on a tube axis Ax of the electron tube 10, between the electron detector 16 and the photocathode 18. In this case, the distance between the photocathode 18 and the electron detector 16 becomes almost fixed across the entire photocathode 18. The photocathode 18 is arranged at the vacuum side of the face plate portion 12*a*, and can convert light that has reached the photocathode 18 through the face plate portion 12*a* from the outside to photoelectrons and emit the photoelectrons toward the electron detector 16. The photocathode 18 can function as a photocathode. The voltage of the photocathode 18 is, for example, −8 kV. The photocathode 18 is a bialkali photocathode of, for example, K2CsSb.

The side tube portion 12*b* has, for example, one end 13*a* connected to a peripheral part 12*q* of the face plate portion 12*a* and the other end 13*b* connected to a peripheral part 12*r* of the stem portion 12*c*. The side tube portion 12*b* is, for example, a circular cylinder. On an inner wall face 13*e* of the side tube portion 12*b*, a metal film 20 electrically connected with the photocathode 18 is preferably evaporated. This allows forming an electric field favorable for electron focusing in the electron tube 10. The metal film 20 is made of, for example, aluminum. If focusing of the photoelectrons is sufficient, the metal film 20 may not be formed.

The stem portion 12*c* is a plate-like member such as, for example, a disk or the like. The stem portion 12*c* is preferably formed with a plurality of openings 17. To each of the plurality of openings 17, a sealing body 30 can be attached. An opening surface of the opening 17 is, for example, circular.

The sealing body 30 preferably has a lid portion 34 connected to a stem portion 12*c* via a joining member 32 made of aluminum, so as to seal the opening 17. Sealing of the opening 17 is preferably realized by being pressurized under a temperature of, for example, 400° C. to 600° C. The joining member 32 is, for example, a ring made of aluminum. The lid portion 34 preferably has a recess portion 34*a* depressed to the vacuum side in the opening 17 and is preferably made of Kovar. Since the surface area of a part corresponding to the opening 17 in the lid portion 34 is preferably larger than a cross-sectional area of the opening 17, the recess portion 34*a* may be depressed to the side (atmosphere side) opposite to the vacuum side. The recess portion 34*a* is formed at, for example, a central portion of the lid portion 34. The bottom surface of the recess portion 34*a* is preferably flat. The shape of the lid portion 34 is, for example, a dish shape.

The lid portion 34 has, for example, a marginal portion 34b surrounding the recess portion 34a. The marginal portion 34b is preferably connected to the stem portion 12c via the joining member 32. The lid portion 34 is preferably arranged outside the vacuum vessel 12 and separated from an inner surface 17p of the opening 17.

The sealing body 30 preferably includes a conductive first tubular member 36 electrically connected to a face 34p at the vacuum side of the lid portion 34 and a first electrode pin 38 to be inserted in and electrically connected to the first tubular member 36. The first electrode pin 38 is preferably separated from the bottom surface of the recess portion 34a. The first tubular member 36 is, for example, a nickel eyelet. The first electrode pin 38 is made of a metal such as, for example, nickel or Kovar. The first tubular member 36 preferably has a flange portion 36a to be electrically connected to the lid portion 34 at one end of the first tubular member 36. The flange portion 36a of the first tubular member 36 is connected to the bottom surface of the recess portion 34a by, for example, welding. The first electrode pin 38 is connected to the first tubular member 36 by, for example, welding. The sealing body 30 may not include the first tubular member 36 and the first electrode pin 38 if a power feeding member is separately provided.

The sealing body 30 preferably includes a conductive second tubular member 40 electrically connected to a face 34q which is at the side opposite to the face 34p at the vacuum side of the lid portion 34 and a second electrode pin 42 to be inserted in and electrically connected to the second tubular member 40. The second electrode pin 42 is preferably separated from the bottom surface of the recess portion 34a. The second tubular member 40 is, for example, a nickel eyelet. The second electrode pin 42 is made of a metal such as, for example, nickel or Kovar. The second tubular member 40 preferably has a flange portion 40a to be electrically connected to the lid portion 34 at one end of the first tubular member 40. The flange portion 40a of the second tubular member 40 is connected to the bottom surface of the recess portion 34a by, for example, welding. The second electrode pin 42 is connected to the second tubular member 40 by, for example, welding. The sealing body 30 may not include the second tubular member 40 and the second electrode pin 42 if a power feeding member is separately provided.

Moreover, the stem portion 12c is preferably formed with a plurality of openings 17a. Each of the plurality of openings 17a is preferably sealed by a sealing body 30a. The sealing body 30a has the same construction as that of, for example, the sealing body 30. The plurality of sealing bodies 30a are connected, in the vacuum vessel 12, by a getter 44 fixed to a power feeder attached to the electrode pins 38. The sealing bodies 30 and 30a are, for example, alternately arranged on a circumference surrounding the projection portion 14.

The projection portion 14 extends from a central part of the stem portion 12c toward the photocathode 18 almost vertical to the stem portion 12c, and can arrange the electron detector 16 at a desirable position in the electron tube 10. Moreover, the projection portion 14 is made of an insulating material, and preferably made of synthetic silica. Since the content of radioactive impurities contained in the synthetic silica is small, the quantity of radiation to be generated from the projection portion 14 is reduced, and generation of noise at the time of radiation detection can be suppressed. The projection portion 14 may be either integrated with the stem portion 12c or provided separately therefrom. The projection portion 14 has, for example, a columnar shape that is almost coaxial with the side tube portion 12b.

The electron detector 16 is made of a semiconductor such as silicon, and has a p-type region 16p (first conductivity-type region) and an n-type region 16n (second conductivity-type region). When the electron detector 16 is made of silicon, since the content of radioactive impurities contained in the silicon is small, the quantity of radiation to be generated from the electron detector 16 is reduced, and generation of noise at the time of radiation detection can be suppressed. The p-type region 16p is made of, for example, a semiconductor doped with p-type impurities, and the n-type region 16n is made of, for example, a semiconductor doped with n-type impurities. The p-type region 16p preferably has an electron incident surface that detects photoelectrons emitted from the photocathode 18. The electron detector 16 has, for example, a square flat plate shape. The electron detector 16 is, for example, an avalanche photodiode, but may be another photodiode. If the electron detector 16 is an avalanche photodiode, output of the electron detector 6 is increased.

The first conductive film 27 and the second conductive film 29 cover a surface 14c of the projection portion 14, and can function as wiring to the electron detector 6. Either one of the first conductive film 27 and the second conductive film 29 may be replaced with a metal wire.

The first conductive film 27 preferably has an electrode pad portion 27a formed on a top face 14b of the projection potion 14. The electrode pad portion 27a is preferably electrically connected to the p-type region 16p by, for example, a gold wire 46 or the like.

The second conductive film 29 preferably has an electrode pad portion 29a formed on the top face 14b of the projection potion 14. The size of the electrode pad portion 29a is, for example, larger than the size of the electrode pad portion 27a. The electrode pad portion 29a is electrically connected to the n-type region 16n by, for example, a conductive adhesive 19. The shape of the electrode pad portion 29a is, for example, a square. The shape of the electrode pad portion 29a is preferably almost the same as the shape of the electrode detector 16 for performing alignment with accuracy.

The first conductive film 27 and the second conductive film 29 may have parts 27p and 29p extending from the root of the projection portion 14 to the opening 17. These parts 27p and 29p are formed on a face 12t at the vacuum side of the stem portion 12c.

The second conductive film 29 is arranged in a manner separated from the first conductive film 27. The separation distance D between the first conductive film 27 and the second conductive film 29 is preferably to such a degree as not to generate current leakage or an electric discharge therebetween, and where a potential difference (bias voltage) between the first conductive film 27 and the second conductive film 29 is provided as Vb(V), the separation distance D is preferably Vb$\mu$m or more. The bias voltage is preferably +300V to 500V. The separation distance D is preferably 300 $\mu$m or more, and more preferably, 500 $\mu$m or more.

The first conductive film 27 and the second conductive film 29 preferably substantially cover the whole surface 14c (side face 14a and top face 14b) of the projection portion 14. The surface area S1 of the projection portion 14 to be covered by the first conductive film 27 is preferably larger than the surface area S2 of the projection portion 14 to be covered by the second conductive film 29. Potential of the first conductive film 27 is preferably a ground potential (0V).

The first conductive film 27 preferably includes a Cr film on the surface 14c of the projection portion 14, a Ni film on the Cr film, and a Au film on the Ni film. The second conductive film 29 preferably includes a Cr film on the surface 14c of the projection portion 14, a Ni film on the Cr film, and a Au film on the Ni film. The film thicknesses of the first conductive film 27 and the second conductive film 29 are preferably approximately 1 μm, respectively. When the gold wire 46 is formed, for satisfactorily connecting the gold wire 46 and the first conductive film 27, the outermost surface is preferably a Au film.

The first conductive film 27 and the second conductive film 29 may include a Ti film on the surface 14c of the projection portion 14, a Pt film on the Ti film, and a Au film on the Pt film, may include a Cr film on the surface 14c of the projection portion 14 and a Au film on the Cr film, or may include a Cr film on the surface 14c of the projection portion 14, a Ni film on the Cr film, and a Cu film on the Ni film.

From the face 12t at the vacuum side of the stem portion 12c to the side face 14a of the projection portion 14, a metal wire 26 may be arranged on the first conductive film 27 and the second conductive film 29. Using the metal wire 26 allows reducing electric resistance and reliably maintaining an electrical connection even at a boundary between the stem portion 12c and the projection portion 14. One end of the metal wire 26 is welded to, for example, an electrode pin 38 of the sealing body 30. Further, for ensuring an electrical connection between the metal wire 26 and the first conductive film 27 and the second conductive film 29, a solder 28 may be formed on the metal wire 26. The metal wire 26 is made of, for example, Kovar.

The face plate portion 12a, the side tube portion 12b, and the stem portion 12c may be provided as separate pieces from each other, or adjacent members thereof may be integrated with each other. In the present embodiment, the face plate portion 12a and the side tube portion 12b are integrated, and the side tube portion 12b and the stem portion 12c are provided as separate pieces from each other. A first metal film 23 is preferably provided by evaporation on an end face 13c of the side tube portion 12b. On a marginal part 15 of the face 12t at the vacuum side of the stem portion 12c, a second metal film 25 arranged facing the first metal film 23 is preferably provided by evaporation. On an outer wall face 13d of the side tube portion 12b adjacent to the end face 13c of the side tube portion 12b, a third metal film 23a is preferably provided by evaporation. The first metal film 23 may be either integrated with the third metal film 23a or provided separately therefrom. The first metal film 23 and the third metal film 23a and the second metal film 25 are contacted with a sealing member 22 made of a low-melting-point metal such as, for example, a solder (InSn, In), and a gap between the side tube portion 12b and the stem portion 12c is sealed by the sealing member 22. Since the sealing member 22 is made of a low-melting point metal, a sealing region is formed so as to climb up onto the third metal film 23a besides between the first metal film 23 and the second metal film 25. Therefore, the gap between the side tube portion 12b and the stem portion 12c can be reliably sealed by the sealing member 22.

The outer wall face 13d of the side tube portion 12b is preferably arranged at a more inner side (closer to the tube axis Ax of the electron tube 10) than a side face 15a of the stem portion 12c. In this case, the sealing member 22 to climb up onto the third metal film 23a can be increased in portion. Accordingly, the gap between the side tube portion 12b and the stem portion 12c can be more reliably sealed. In the marginal part 15 of the face 12t at the vacuum side of the stem portion 12c, it is preferable that the distance between an imaginary plane including the end face 13c of the side tube portion 12b and the marginal part 15 becomes larger as it goes to the outside (direction to separate from the tube axis Ax of the electron tube 10). In this case, since a larger portion of sealing member 22 can be held between the end face 13c and the marginal part 15, the gap between the side tube portion 12b and the stem portion 12c can be more reliably sealed. Moreover, the sealing member 22 can be suppressed from sticking out into the vacuum vessel 12. For example, it is preferable that the marginal part 15 of the face 12t at the vacuum side of the stem portion 12c slants so that the thickness of the stem portion 12c is gradually reduced as it goes to the outside.

A chamfered portion 13p may be formed at the outer wall face 13d side in the end face 13c of the side tube portion 12b. If the chamfered portion 13p is formed, a larger portion of sealing member 22 can be held between the end face 13c and the marginal part 15, and thus the gap between the side tube portion 12b and the stem portion 12c can be more reliably sealed. A chamfered portion 13q may be formed at the inner wall face 13e side in the end face 13c of the side tube portion 12b. If the chamfered portion 13q is formed, a larger portion of sealing member 22 can be held between the end face 13c and the marginal part 15 in conjunction with the metal film on the chamfered portion 13q, and thus the sealing member 22 can be further suppressed from sticking out into the vacuum vessel 12.

The first metal film 23 preferably includes a Cr film on the end face 13c of the side tube portion 12b, a Ni film on the Cr film, and a Au film on the Ni film. In this case, the gap between the side tube portion 12b and the stem portion 12c can be more reliably sealed. The first metal film 23 may include a Ti film on the end face 13c, a Pt film on the Ti film, and a Au film on the Pt film, may include a Cr film on the end face 13c, a Ni film on the Cr film, and a Cu film on the Ni film, or may include a Cr film on the end face 13c and a Au film on the Cr film.

The second metal film 25 preferably includes a Cr film on the marginal part 15 of the face 12t at the vacuum side of the stem portion 12c, a Ni film on the Cr film, and a Au film on the Ni film. In this case, the gap between the side tube portion 12b and the stem portion 12c can be more reliably sealed. The second metal film 25 may include a Ti film on the marginal part 15, a Pt film on the Ti film, and a Au film on the Pt film, or may include a Cr film on the marginal part 15, a Ni film on the Cr film, and a Cu film on the Ni film.

The third metal film 23a preferably includes a Cr film on the outer wall face 13d of the side tube portion 12b, a Ni film on the Cr film, and a Au film on the Ni film. In this case, the gap between the side tube portion 12b and the stem portion 12c can be more reliably sealed. The third metal film 23a may include a Ti film on the outer wall face 13d, a Pt film on the Ti film, and a Au film on the Pt film, may include a Cr film on the outer wall face 13d, a Ni film on the Cr film, and a Cu film on the Ni film, or may include a Cr film on the end face 13c and a Au film on the Cr film.

In the electron tube 10 of the present embodiment, since the first conductive film 27 and the second conductive film 29 closely adhered to the projection portion 14 that holds the electron detector 16 are used as the wiring to be connected to the electron detector 16, the wiring can be reliably connected to the electron detector 16 and the wiring can be stably installed. Since the first conductive film 27 and the second conductive film 29 cover the surface 14c of the projection portion 14, even when photoelectrons from the photocathode 18 or reflected or scattered electrons thereof are made incident into the projection portion 14, charging thereof can be suppressed. As a result, the electric field around the projection portion 14 can be stabilized. Moreover, when the projection portion 14 is made of synthetic silica, since the content of radioactive impurities contained in the synthetic silica is small, the quantity of radiation to be generated from the electron tube 10 itself is reduced.

The first conductive film 27 and the second conductive film 29 preferably substantially cover the whole surface 14c of the projection portion 14. In this case, since charging of the projection portion 14 can be further suppressed, the electric field around the projection portion 14 can be further stabilized.

It is preferable that the surface area S1 of the projection portion 14 to be covered by the first conductive film 27 is larger than the surface area S2 of the projection portion 14 to be covered by the second conductive film 29, and potential of the first conductive film 27 is a ground potential. In this case, since most of the whole surface 14c of the projection portion 14 comes to have a ground potential having less voltage fluctuation, the electric field around the projection portion 14 can be further stabilized.

It is preferable that the first conductive film 27 and the second conductive film 29 each include a Cr film on the surface 14c of the projection portion 14, a Ni film on the Cr film, and a Au film on the Ni film. In this case, the thickness of the first conductive film 27 and the second conductive film 29 can be increased. Accordingly, electric resistance of the first conductive film 27 and the second conductive film 29 can be reduced.

In the electron tube 10, a vacuum can be maintained by the lid portion 34 sealing the opening 17 via the joining member 32. Also, since the coefficient of thermal expansion of synthetic silica is different from that of Kovar, if the lid portion 34 has a flat plate shape, the surface area of a part corresponding to the opening 17 in the lid portion 34 becomes almost equal to a cross-sectional area of the opening 17, and thus there is a possibility that the lid portion 34 is damaged due to stress at cooling so that a vacuum can no longer be maintained. However, in the electron tube 10, since the lid portion 34 has the recess portion 34a, the surface area of a part corresponding to the opening 17 in the lid portion 34 becomes larger than a cross-sectional area of the opening 17, and therefore, a vacuum can be maintained by absorbing the stress in the recess portion 34a. Moreover, since the recess portion 34a is depressed to the vacuum side, an unreasonable force is not easily applied to the lid portion 34 even due to a difference between the internal and external pressures of the vacuum vessel 12. Further, since the lid portion 34 is electrically connected to the electron detector 16 via the first conductive film 27 and the second conductive film 29, a potential can be imparted to the electron detector 16 by imparting the potential to the lid portion 34.

It is preferable that the lid portion 34 has the marginal portion 34b surrounding the recess portion 34a, and the marginal portion 34b is connected to the stem portion 12c via the joining member 32. In this case, since the stress can be absorbed in the whole recess portion 34a, a vacuum can be more reliably maintained.

When the lid portion 34 is arranged outside the vacuum vessel 12 and separated from the inner surface 17p of the opening 17, the creepage distance between the lid portion 34 and its adjacent potential applying member (for example, the neighboring first electrode pin 38) is long as compared to when the lid portion 34 is in contact with the inner surface 17p of the opening 17. As a result, generation of current leakage can be suppressed.

The bottom surface of the recess portion 34a is preferably flat. In this case, it is easy to join the first tubular member 36 and the second tubular member 40 to the bottom surface of the recess portion 34a.

The electron tube 10 preferably includes the first tubular member 36, the second tubular member 40, the first electrode pin 38, and the second electrode pin 42. The first tubular member 36 and the second tubular member 40 allow reliably fixing the first electrode pin 38 and the second electrode pin 42 to the lid portion 34, respectively. Moreover, since the first electrode pin 38 and the second electrode pin 42 need not penetrate through the lid portion 34, a vacuum can be more reliably maintained.

The first tubular member 36 and the second tubular member 40 preferably have the flange portion 36a and the flange portion 40a to be electrically connected to the lid portion 34 at ends of the first tubular member 36 and the second tubular member 40, respectively. In this case, the flange portion 36a and the flange portion 40a allow reliably fixing the first tubular member 36 and the second tubular member 40 to the lid portion 34, respectively.

The electron tube 10 can be used as a radiation detector in combination with a scintillator that emits light upon incidence of radiation. In that case, since the quantity of radiation to be generated from the electron tube 10 is reduced, noise at the time of radiation detection is reduced. In particular, since the electron tube 10 has a structure without a dynode being an electron-multiplier section made of a metal, the quantity of radiation to be generated from the electron tube 10 is further reduced by using the electron tube 10. Therefore, usage of the electron tube 10 is particularly effective for detecting a minute quantity of radiation. It is preferable to arrange a plurality of electron tubes 10 so as to surround the scintillator. For the scintillator, Xe may be used, or Ar may be used.

The electron tube 10 is manufactured in the following manner. First, the openings 17 and 17a are formed in a flat plate-shaped stem portion to obtain the stem portion 12c. In addition, the recess portion 34a is formed in a flat plate-shaped lid portion to obtain the lid portion 34. Further, the first electrode pin 38 and the second electrode pin 42 are inserted in the first tubular member 36 and the second tubular member 40 and welded thereto, respectively, and the first tubular member 36 and the second tubular member 40 are welded to both surfaces of the lid portion 34, respectively. Then, the joining member 32 is interposed between the stem portion 12c and the lid portion 34, and the openings 17 and 17a are sealed by heating and pressurization. In this manner, the sealing bodies 30 and 30a attached to the stem portion 12c are obtained.

Further, the first conductive film 27 and the second conductive film 29 are evaporated on the projection portion 14 and the stem portion 12c. The first metal film 23 is evaporated on the end face 13c of the side tube portion 12b, and the third metal film 23a is evaporated on the outer wall face 13d of the side tube portion 12b. The second metal film 25 is evaporated on the marginal part 15 of the face 12t at the vacuum side of the stem portion 12c. Then, the electron detector 16 is installed on the electrode pad portion 29a via the conductive adhesive 19. Then, the gold wire 46 is bonded. Further, the metal wire 26 is welded to the electrode pin 38, and the metal wire 26 and the first conductive film 27 and the second conductive film 29 are adhered by the solder 28.

Subsequently, in a vacuum, a low-melting-point metal is placed on the second metal film 25 and heated to the melting point of the low-melting-point metal or more, for example, 200° C. Then, the molten low-melting-point metal is shaped. Further, the photocathode 18 is formed on the face plate portion 12a. The stem portion 12c and the side tube portion 12b are set on a sealing unit. By pushing up its table on which the stem portion 12c has been set, the stem portion 12c and the side tube portion 12b are joined in a vacuum. The sealing member 22 made of a low-melting-point metal is thereby formed. The sealing temperature is preferably, for example, 200° C. In this case, influence on the photocathode 18 is small.

Second Embodiment

Figure 6:
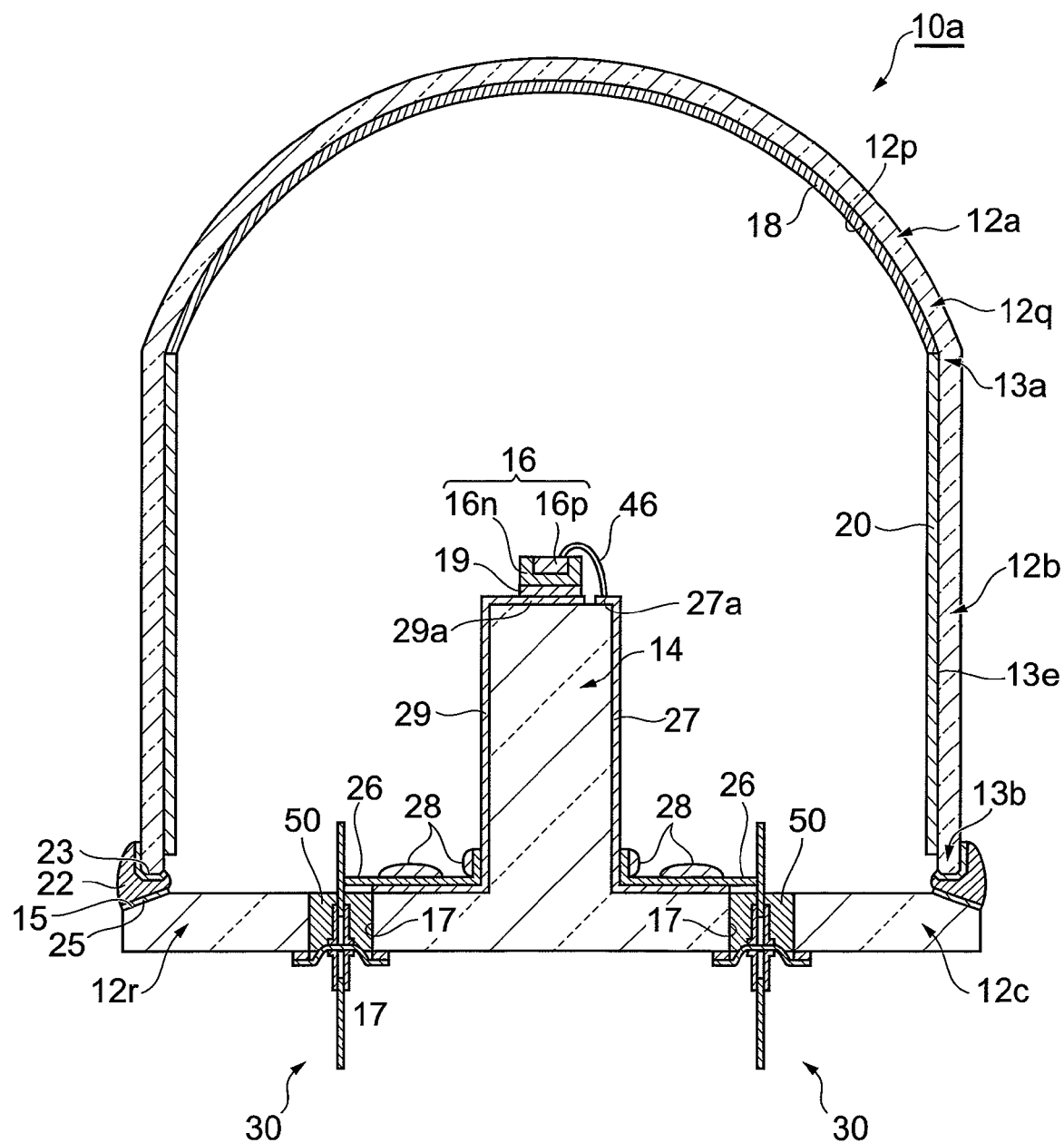
FIG. 6 is a longitudinal sectional view of an electron tube according to a second embodiment.

FIG. 6 is a longitudinal sectional view of an electron tube according to a second embodiment. The electron tube 10a shown in FIG. 6 further includes a conductive member 50 filled in the opening 17, besides the construction of the electron tube 10 shown in FIG. 1 to FIG. 5. The conductive member 50 is made of a low-melting-point metal such as, for example, a solder (InSn, In). In this case, the conductive member 50 can further ensure sealing and an electrical connection as well as improve the strength of a wiring portion.

Third Embodiment

Figure 7:
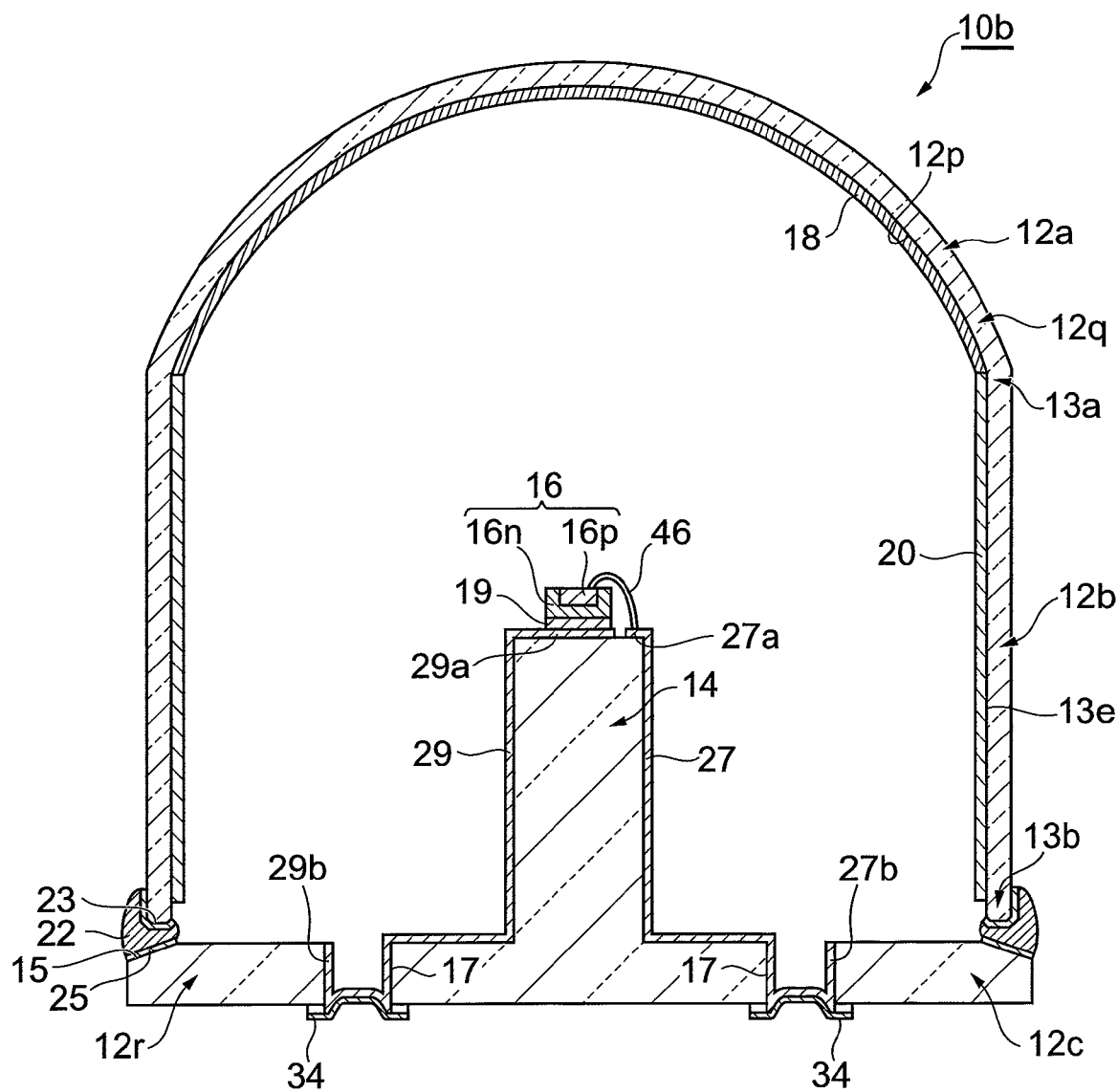
FIG. 7 is a longitudinal sectional view of an electron tube according to a third embodiment.

FIG. 7 is a longitudinal sectional view of an electron tube according to a third embodiment. The electron tube 10b shown in FIG. 7 does not include the metal wire 26, the solder 28, the first tubular member 36, the first electrode pin 38, the second tubular member 40, and the second electrode pin 42 in the construction of the electron tube 10 shown in FIG. 1 to FIG. 5, but the first conductive film 27 includes an end portion 27b, and the second conductive film 29 includes an end portion 29b. The end portion 27b and the end portion 29b are formed so as to cover the inner surface 17p of the opening 17 and the face 34p at the vacuum side of the lid portion 34. That is, most of the wiring from the electron detector 16 to the lid portion 34 to serve as an electrical connection portion with the outside is formed by the conductive film. At that time, a corner region where the conductive film can possibly be disconnected may be reinforced with a conductive material such as a solder, or a plurality of conductive films formed only in a face-like portion may be electrically connected by a conductive material such as a solder. In the electron tube 10b, the wiring is easily formed, as well as being closely fitted to the internal structure, and thus the space for wiring can be minimized.

Fourth Embodiment

Figure 8:
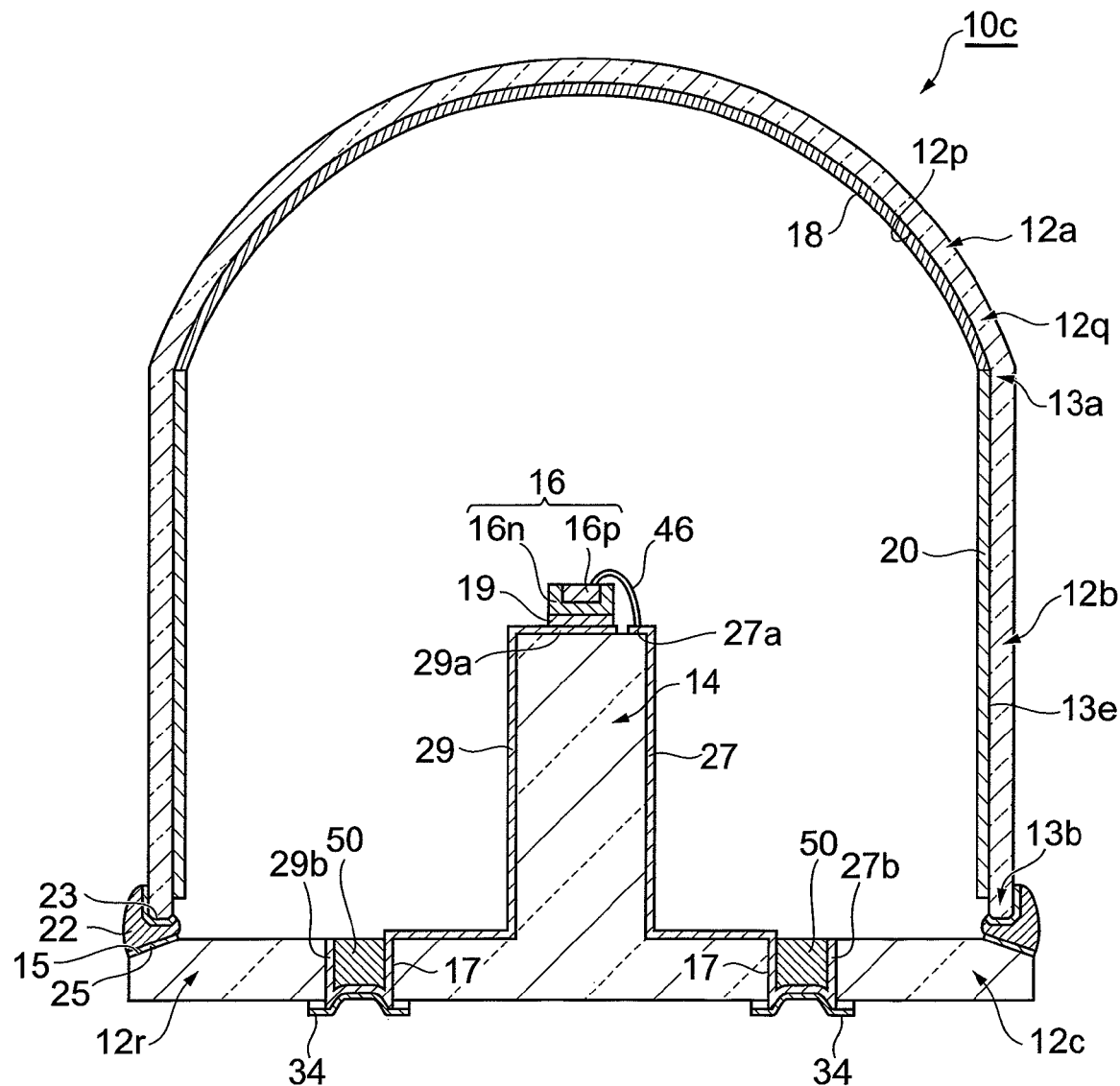
FIG. 8 is a longitudinal sectional view of an electron tube according to a fourth embodiment.

FIG. 8 is a longitudinal sectional view of an electron tube according to a fourth embodiment. The electron tube 10c shown in FIG. 8 further includes a conductive member 50 filled in the opening 17, besides the electron tube 10b shown in FIG. 7. The conductive member 50 is made of a low-melting-point metal such as, for example, a solder (InSn). In this case, effects of both the electron tubes 10a and 10b can be obtained.

Although preferred embodiments of the present invention have been described in detail in the above, the present invention is by no means limited to the above embodiments, or by no means limited to constructions that provide the above various effects. For example, an electrode that seals the opening 17 and is electrically connected to the first conductive film 27 and the second conductive film 29 may be used in place of the sealing body 30. At least one of the face plate portion 12a, the stem portion 12c, the side tube portion 12b, and the projection portion 14 may be made of a material other than synthetic silica. The relationship between the surface area (S1) of the first conductive film 27 and the surface area (S2) of the second conductive film 29 may be opposite (S2>S1). In this case, a signal from the electron detector 16 can be extracted with more suppressed noise. While the whole side face of the projection portion 14 may be covered only with the first conductive film 27, wiring may be separately provided to the n-type region 16n, and vice versa.

Here, the generation quantity of radiation was measured in terms of a Kovar glass (borosilicate glass), Kovar (Fe—Ni—Co alloy), and synthetic silica in order to confirm that the generation quantity of radiation is small in synthetic silica. In the measurement, Corning 7056 was used as a sample of the Kovar glass, and KV-2, as a sample of Kovar, and an ES grade, as a sample of synthetic silica. Concretely, a germanium radiation detector manufactured by EG&G Inc. was used to measure the energy and count of gamma rays emitted by radioactive impurities contained in the samples. The measured radioactive impurities were 40K (a radioisotope of potassium), a uranium series (a decay series from uranium-238 to lead-206), and a thorium series (a decay series from thorium-232 to lead-208).

Measurement results are shown in Table 1. The figures in the table are in units of Bq/kg.

TABLE 1

|  | 40K | Uranium series | Thorium series |
| --- | --- | --- | --- |
| Kovar glass | 1500 | 10 | 1 |
| Kovar | 0.1 | 0.2 | 0.1 |
| Synthetic silica | 0 | 0.002 | 0 |

What is claimed is:

1. An electron tube comprising:
a vacuum vessel including a face plate portion and a stem portion arranged facing the face plate portion;
a photocathode arranged in the vacuum vessel and formed on the face plate portion;
a projection portion arranged in the vacuum vessel, extending from the stem portion toward the face plate portion, and made of an insulating material;
an electron detector arranged on the projection portion, made of a semiconductor, and having a first conductivity-type region and a second conductivity-type region;
a first conductive film covering a surface of the projection portion and configured so as to be electrically connected to the first conductivity-type region; and
a plurality of stem pins surrounding the projection portion and penetrating through the stem portion,
wherein the first conductive film is configured so as to face the photocathode,
wherein the first conductive film covers a side face of the projection portion and is exposed to an internal space of the vacuum vessel,
wherein at least one of the plurality of stem pins is electrically connected to the first conductive film over the side face of the projection portion with a metal wire,
wherein no wiring is formed in the projection portion, the electron detector being supported by a top face of the projection portion,
the electron tube further comprising a second conductive film covering a surface of the projection portion, to be electrically connected to the second conductivity-type region, and arranged in a manner separated from the first conductive film,
wherein the first conductive film and the second conductive film substantially cover the whole surface of the projection portion,
wherein an area to be covered by the first conductive film is larger than an area to be covered by the second conductive film in a side face of the projection portion, and an area to be covered by the first conductive film is smaller than an area to be covered by the second conductive film in a top face of the projection portion, and wherein a portion projecting inside the vacuum vessel of each stem pin is electrically connected to a base of each of the first and second conductive films with a metal wire.

2. The electron tube according to claim 1, wherein a surface area of the projection portion to be covered by the first conductive film is larger than a surface area of the projection portion to be covered by the second conductive film, and potential of the first conductive film is a ground potential.

3. The electron tube according to claim 1, wherein the first conductive film includes a Cr film on a surface of the projection portion, a Ni film on the Cr film, and a Au film on the Ni film.

* * * * *